United States Patent [19]

Ogawa et al.

[11] Patent Number: 4,578,781

[45] Date of Patent: Mar. 25, 1986

[54] MIS TRANSISTOR CIRCUIT

[75] Inventors: Junji Ogawa, Yokohama; Tomio Nakano; Masao Nakano, both of Kawasaki; Norihisa Tsuge, Kamakura; Takashi Horii, Yokohama, all of Japan

[73] Assignee: Fujitsu Limited, Kawasaki, Japan

[21] Appl. No.: 413,405

[22] Filed: Aug. 31, 1982

[30] Foreign Application Priority Data

Aug. 31, 1981 [JP] Japan .............................. 56-135585

[51] Int. Cl.$^4$ ............................................... G11C 7/00
[52] U.S. Cl. .................................... 365/203; 365/205; 365/210
[58] Field of Search ............... 365/189, 190, 208, 210, 365/230, 203, 154, 205

[56] References Cited

U.S. PATENT DOCUMENTS

| | | | |
|---|---|---|---|
| 4,061,999 | 12/1977 | Proebsting et al. | 365/203 |
| 4,291,393 | 9/1981 | Wilson | 365/203 |
| 4,387,448 | 6/1983 | Takemae et al. | 365/203 |
| 4,503,343 | 3/1985 | Ohuchi | 365/203 |

Primary Examiner—James W. Moffitt
Attorney, Agent, or Firm—Staas & Halsey

[57] ABSTRACT

An MIS transistor circuit which is operated alternately in a reset state and in an active state, comprises a voltage holding circuit for holding a power supply voltage applied in each reset state so as to provide a clamped voltage. The clamped voltage is applied during each active state to the desired nodes of the MIS transistor circuit as an actual power supply voltage, whereby error operation due to voltage fluctuation of the power supply voltage is prevented.

15 Claims, 10 Drawing Figures

MIS TRANSISTOR CIRCUIT

BACKGROUND OF THE INVENTION

1. Field of the Invention

The present invention relates to a metal-insulation semiconductor (MIS) transistor circuit. More particularly it relates to an MIS transistor circuit which is operated alternately in a reset state or in an active state, the MIS transistor circuit having a voltage holding circuit integrated therein for preventing error operations due to variations of the power supply voltage.

2. Description of the Prior Art

Some types of MIS transistor circuits, for example, a dynamic MIS memory, can be operated alternately in a reset state or an active state. Such circuits are hereinafter referred to as dynamic MIS transistor circuits. In the reset state, the various operating points (nodes) in a dynamic MIS transistor circuit are charged or discharged to a predetermined potential level, whereby the dynamic MIS transistor circuit can perform a desired active operation in the active state.

During operation of the dynamic MIS transistor circuits, however, the power supply voltage often fluctuates due to external noise, or due to turning on or off of peripheral circuits, etc. Due to the fluctuations, the power supply voltage during the active period often differs from the power supply voltage during the preceeding reset period. This impedes the normal operation of the dynamic MIS transistor circuit, as hereinafter described in detail.

SUMMARY OF THE INVENTION

An object of the present invention is, therefore, to prevent error operations of a dynamic MIS transistor circuit due to fluctuations of the power supply voltage therein.

A second object of the present invention is to provide a dynamic MIS transistor circuit having a voltage holding circuit for holding a power supply voltage during each reset state and for providing a constant voltage during each active state, the constant voltage being equal to the voltage at the preceeding reset interval.

A third object of the present invention is to prevent error operations of a dynamic MIS memory due to fluctuations of the power supply voltage therein.

A fourth object of the present invention is to provide a dynamic MIS memory having a voltage holding circuit for holding the power supply voltage during each reset state and for providing a constant voltage during each active state, the constant voltage being equal to the voltage at the preceeding reset interval.

In order to achieve the above objects, there is provided an MIS transistor circuit operated alternately in a reset state or an active state and comprising one or more operating nodes and one or more input terminals. Each of the operating nodes is charged or discharged in the reset state. The MIS transistor circuit is operated in response to input signals applied to the input terminals during the active state. The MIS transistor circuit further comprises a voltage holding circuit for holding a power supply voltage applied during the reset state so as to provide a clamped voltage. The clamped voltage is applied, during the active state, as an actual power supply voltage to the desired nodes of the MIS transistor circuit.

According to a first aspect of the invention, the MIS transistor circuit is an MIS dynamic memory comprising bit lines and word lines cross-coupled with each other, dynamic-type memory cells connected between the bit lines and the word lines, active pull-up circuits for selectively pulling up the voltages of the bit lines in the active state, and driving circuits for selectively driving the active pull-up circuits in the active state, the clamped voltage being applied to a power supply line of each of the driving circuits.

According to a second aspect of the invention, the MIS transistor circuit is an MIS dynamic memory comprising bit lines and word lines cross-coupled with each other, dynamic-type memory cells connected between the bit lines and the word lines, dummy cells for storing reference information, dummy word lines connected through the dummy cells to the bit lines, respectively, and a dummy word line clamping circuit for clamping the potentials of the dummy word lines to predetermined levels, the clamped voltage being applied to a power supply line of the dummy word line clamping circuit.

According to a third aspect of the invention, the MIS transistor circuit is a clock signal generating circuit comprising a bootstrap circuit having a plurality of inverters for amplifying and waveform shaping an input signal and a transfer transistor for charging a predetermined node during the bootstrap circuit in the reset state. The transfer transistor has a gate, a drain, and a source, the source and the drain being connected between two of the inverters, the clamped voltage being applied to the gate of the transfer transistor.

According to a fourth aspect of the invention, the voltage holding circuit comprises an MIS transistor having a gate operatively connected to receive a reset signal during the reset state, a capacitor connected in series with the MIS transistor, and a resistor connected in parallel with the MIS transistor. The MIS transistor and the capacitor constitute a first time constant circuit having a first time constant shorter than a reset interval during the reset state a The resistor and the capacitor constitute a second time constant circuit having a second time constant longer than an active interval during the active state.

According to a fifth aspect of the invention, the capacitor is an MIS capacitor.

BRIEF DESCRIPTION OF THE DRAWINGS

The above objects and advantages as well as other features of the present invention will be better understood from the following description with reference to the accompanying drawings, in which.

DESCRIPTION OF THE PREFERRED EMBODIMENTS

Figure 1:
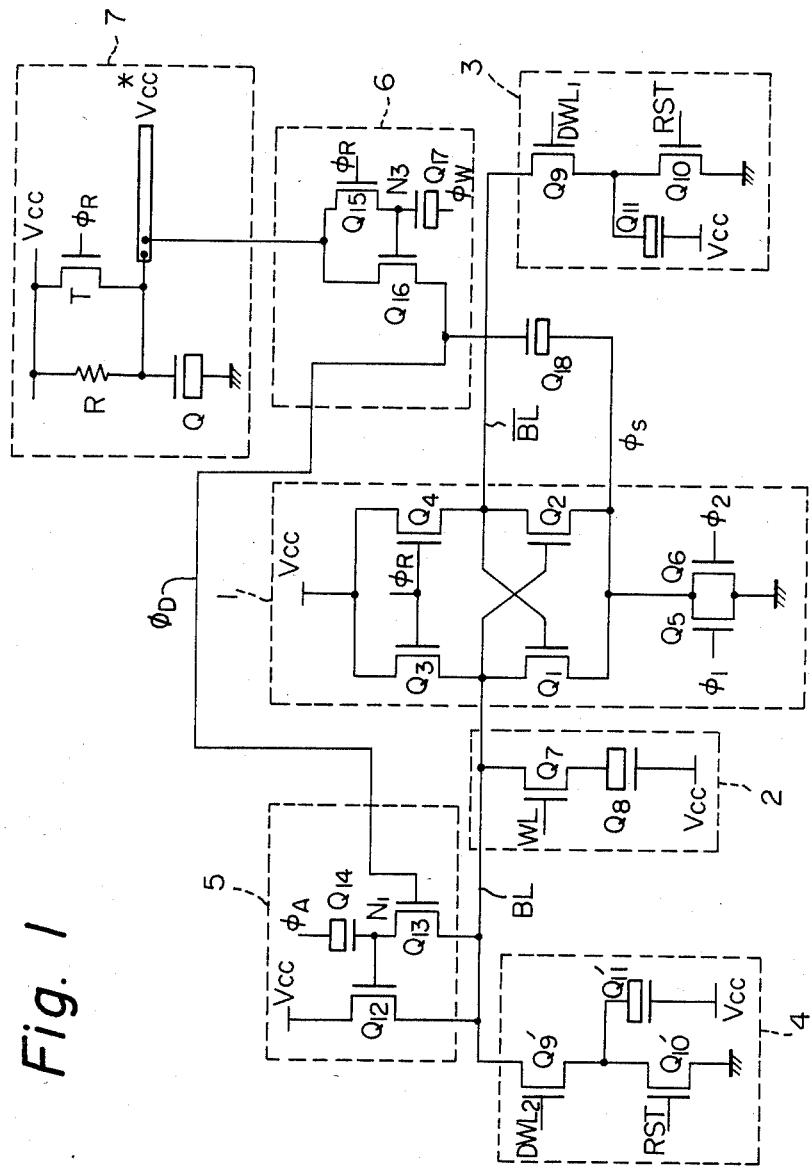
FIG. 1 is a circuit diagram of a part of a dynamic random access memory (RAM) of a one-transistor one-capacitor type including a voltage holding circuit, according to a first embodiment of the present invention.

For the sake of simplicity, all of the MIS transistors illustrated in the drawings and described in the following are of the N-channel type. However, as will be readily understood by those skilled in the art, these N-channel MIS transistors may be substituted for P-channel MIS transistors. Also, in the following description, the electric potential near a power supply potential $V_{CC}$ is referred to as an H level, and the potential near ground potential $V_{SS}$ is referred to as an L level. The term "charge" means a positive charge.

In FIG. 1, a part of a one-transistor one-capacitor dynamic RAM is illustrated. This part of the RAM comprises a sense amplifier 1 connected to bit lines BL and $\overline{BL}$, a one-transistor one-capacitor type memory cell 2 connected between the bit line BL and a word line WL, two dummy cells 3 and 4 connected to the bit lines BL and $\overline{BL}$, respectively, an active pull-up circuit 5 connected to the bit line BL, and a clock signal generating circuit 6 for driving the active pull-up circuit 5. In an actual RAM, a plurality of bit lines and word lines are cross-coupled with each other, and a plurality of memory cells, a dummy cell, and an active pull-up circuit are connected to each bit line. For the sake of simplicity, however, they are not all shown in FIG. 1.

The circuits 1 to 6 themselves are well known. Briefly, the sense amplifier 1 comprises MIS transistors $Q_1$ through $Q_6$ for detecting the potential difference between the bit lines BL and $\overline{BL}$. More precisely, during the reset intervals, a reset signal $\phi_R$ having a potential higher than the H level is applied to the gates of the transistors $Q_3$ and $Q_4$ so that the bit lines BL and $\overline{BL}$ are charged to the H level. In the active intervals, when the memory cell 2 is selected to read information stored therein, the word line WL and a dummy word line $DWL_1$ connected to the dummy cell 3 are selected to be the H level. This causes the potentials of both bit lines BL and $\overline{BL}$ to be lowered. However, depending on the difference between information stored in the memory cell 2 and in the dummy cell 3, a potential difference appears between the bit lines BL and $\overline{BL}$. The transistors $Q_1$ and $Q_2$ in the sense amplifier amplify this potential difference.

In order to reliably charge the bit lines BL and $\overline{BL}$ to the H level during each reset interval, additional circuits other than the transistors $Q_3$ and $Q_4$ are necessary in practice. For the sake of simplicity, however, these additional circuits are not shown in FIG. 1.

The memory cell 2 comprises an MIS transistor $Q_7$ and an MIS capacitor $Q_8$. In the MIS capacitor $Q_8$, an information "1" or "0" is stored. Although, for simplification, the figure shows only one memory cell connected to the bit line BL, a number of memory cells are, in practice, connected to the bit line BL and $\overline{BL}$.

The dummy cell 3 comprises transistors $Q_9$ and $Q_{10}$ and an MIS capacitor $Q_{11}$. During each reset interval, a reset signal RST having the H level is applied to the gate of the transistor $Q_{10}$ so that the charges stored in the MIS capacitor $Q_{11}$ are discharged through the transistor $Q_{10}$ to ground. During an active interval, the reset signal RST is turned to the L level. In this state, when the dummy word line $DWL_1$ is selected to be the H level for selecting the memory cell 2 connected to the selected bit line BL, charges on the non-selected bit line $\overline{BL}$ flow through the transistor $Q_9$ into the MIS capacitor $Q_{11}$ so that the potential of the non-selected bit line $\overline{BL}$ is lowered to a predetermined reference value determined by the capacitance of the MIS capacitor $Q_{11}$.

Similarly, the dummy cell 4 also comprises transistors $Q_9'$ and $Q_{10}'$ and an MIS capacitor $Q_{11}'$. The dummy word line $DWL_2$ connected to the gate of the transistor $Q_9'$ is selected to be the H level when a memory cell connected to the bit line $\overline{BL}$ is selected. The operation of the dummy cell 4 is similar to that of the dummy cell 3.

The active pull-up circuit 5 comprises transistors $Q_{12}$ and $Q_{13}$ and an MIS capacitor $Q_{14}$. This circuit 5 operates to expand the potential difference between the bit lines BL and $\overline{BL}$ after the sense amplifier 1 starts to operate. For the sake of simplicity, only one active pull-up circuit 5 is illustrated as being connected to the bit line BL. In practice, however, another pull-up circuit is connected to the bit line $\overline{BL}$.

The clock signal generating circuit 6 comprises transistors $Q_{15}$ and $Q_{16}$ and an MIS capacitor $Q_{17}$. This circuit 6 operates to generate a clock signal $\phi_D$ for driving the active pull-up circuit 5. The clock signal $\phi_D$ is applied to the gate of the transistor $Q_{13}$ in the active pull-up circuit 5.

Conventionally, the power supply lines of all of the above-mentioned circuits 1 through 6 are connected to a conventional common power supply line $V_{CC}$. In contrast, in the embodiment of the present invention of FIG. 1, a voltage holding circuit 7, for holding the power supply voltage, is provided. In the embodiment of FIG. 1, a constant voltage power supply line $V_{CC}^*$, which is the output of the voltage holding circuit 7, is connected to the power supply line of the clock signal generating circuit 6.

Figure 2A:
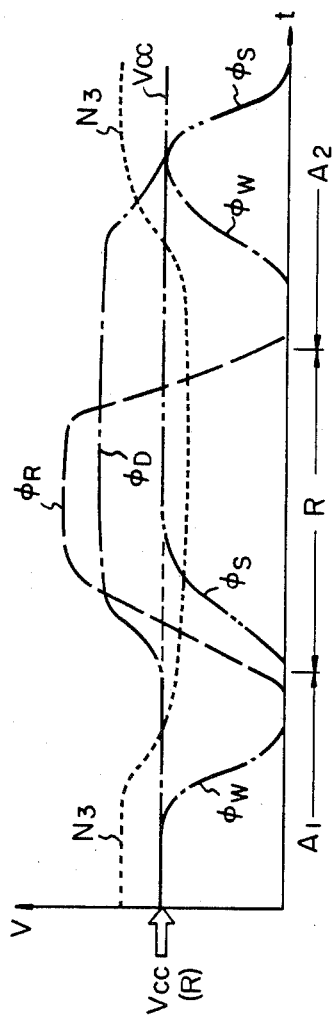
FIG. 2A is a waveform diagram for explaining the general operation of the circuit of FIG. 1.

The general operation of the circuit of FIG. 1 will be understood from the waveform diagram of FIG. 2A, which shows the case when the power supply voltage does not fluctuate. In FIG. 2A, $A_1$ and $A_2$ are active intervals, and R is a reset interval. The active interval and the reset interval are repeated alternately. In each active interval, the reset signal $\phi_R$ is the L level so that the bit line BL or $\overline{BL}$ is at the L level, resulting in the potential of a signal $\phi_S$ at the sources of the transistors $Q_1$ and $Q_2$ being the L level, and the potential of a signal $\phi_W$ is raised to the H level to boost the potential at the node $N_3$, connected to the gate of the transistor $Q_{16}$ to be higher than the H level. Thus, the transistor $Q_{16}$ is turned on so that the potential of the clock signal $\phi_D$ for driving the active pull-up circuit 5 is at the H level. In each reset interval, the potential of the reset signal $\phi_R$ is raised to be higher than the H level, so that both of the bit lines BL and $\overline{BL}$ have the H level potential, resulting in the signal $\phi_S$ being at the H level. The signal $\phi_W$ is lowered to the L level, and, therefore, the potential of the clock signal $\phi_D$ is boosted by an MOS capacitor $Q_{18}$ to a level higher than the H level by at least a threshold voltage of the transistor $Q_{13}$.

Figure 2B:
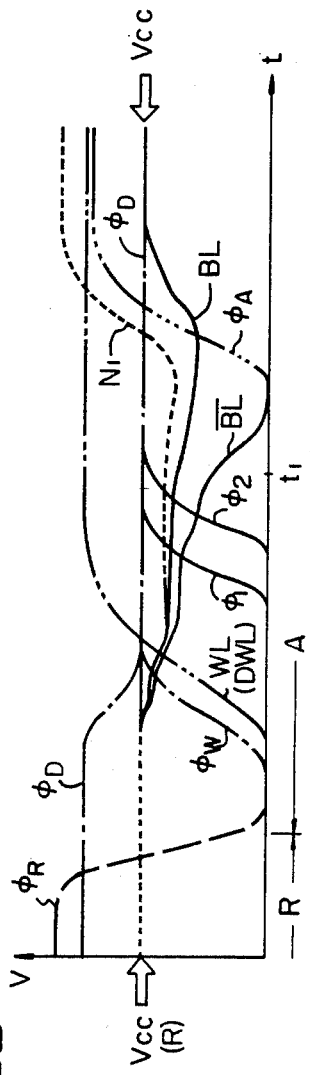
FIG. 2B is a waveform diagram for explaining the normal operation of the circuit of FIG. 1.

The normal operation of the pull-up circuit 5 will be seen from the waveform diagram of FIG. 2B, which shows the case when the power supply voltage does not fluctuate. In FIG. 2B, during the reset interval R, the potential of the reset clock signal $\phi_R$ is at a level higher than the power supply voltage applied to the power supply line $V_{CC}$ (hereinafter, the power supply voltage is also referred to as $V_{CC}$), and the potential of the clock signal $\phi_D$ is also higher than the power supply voltage $V_{CC}$, as mentioned before. After the reset clock signal $\phi_R$ falls to the L level, an active interval A starts and the potential of the clock signal $\phi_D$ gradually decreases to the H level. For rapid charging up of the clock signal $\phi_D$ to the potential higher than $V_{CC}$ in the next reset interval, the potential of the clock signal $\phi_D$ must be clamped to the H level. For the purpose of this, the clock signal $\phi_W$ is applied to the MIS capacitor $Q_{17}$ for boosting the node $N_3$ to keep the transistor $Q_{16}$ on. Thus, during the active interval, the potential of the clock signal $\phi_D$ is kept at the H level.

When the memory cell 2 is selected, the word line WL and the dummy word line $DWL_1$ are selected to be a level higher than the H level. Then, charges on the bit lines BL and $\overline{BL}$ flow into the MIS capacitors $Q_8$ and $Q_{11}$, respectively, causing the potential of the bit lines BL and $\overline{BL}$ to be lowered. The capacitance of the MIS capacitor $Q_{11}$ in the dummy cell 3 is, as is well known, the one that provides a reference voltage which is an intermediate value between the H level and the L level. Therefore, if the MIS capacitor $Q_8$ in the memory cell 2 stores an information "1", the charges passed from the bit line BL to the MIS capacitor $Q_8$ are less than the charges passed from the bit line $\overline{BL}$ to the MIS capacitor $Q_{11}$, resulting in a positive potential difference between the bit lines BL and $\overline{BL}$, i.e., the potential of the bit line BL is higher than the potential of the bit line $\overline{BL}$. If the MIS capacitor $Q_8$ stores "0", a negative potential is produced between the bit lines BL and $\overline{BL}$.

Then, clock signals $\phi_1$ and $\phi_2$ are applied to the gates of the transistors $Q_5$ and $Q_6$. The reason why the two clock signals $\phi_1$ and $\phi_2$ are used is merely to prevent error operations of the sense amplifier 1. The clock signals $\phi_1$ and $\phi_2$ activate the sense amplifier 1 to amplify the above-mentioned potential difference. In FIG. 2B, the potential of the selected bit line BL is higher than the potential of the nonselected bit line $\overline{BL}$. This means that the memory cell 2 stores the information "1". Thus, at a time $t_1$, the amplified potential difference between the bit lines BL and $\overline{BL}$ is read through the sense amplifier 1 to an output circuit (not shown). After the time $t_1$, the charges stored in the MIS capacitor $Q_8$ and on the bit line BL are gradually discharged as a leakage current through the transistor $Q_1$ or a coupling noise due to the gate capacitance of the transistor $Q_2$, resulting in a still lowered potential of the bit line BL. Therefore, the charges in the MIS capacitor $Q_8$ become too small to represent the storing information of "1". In order to sufficiently charge the MIS capacitor $Q_8$, after the sense amplifier 1 senses the potential difference, during the active interval, the active pull-up circuit 5 is activated to charge the bit line BL. That is, the potential of the clock signal $\phi_A$ is raised to a level higher than the H level. Since the potential of the clock signal $\phi_D$ is clamped to the H level, the transistor $Q_{13}$ is in an off state. Therefore, the potential at the node $N_1$, connected to the gate of the transistor $Q_{13}$, is boosted to a level higher than the H level so that the transistor $Q_{12}$ is turned on, and charges are supplied from the power supply line $V_{CC}$, through the transistor $Q_{12}$, the bit line BL, and the transistor $Q_7$, to the MIS capacitor $Q_8$. Thus, the MIS capacitor $Q_8$ is charged again to store the information "1" and the bit line BL is charged again to be the H level. The clock signal $\phi_A$ is simultaneously applied to both of the active pull-up circuits connected to the bit lines BL and $\overline{BL}$. If the MIS capacitor $Q_8$ stores an information "0", the potential of the bit line BL is sufficiently lowered to turn on the transistor $Q_{13}$ so that the charges on the node $N_1$ are discharged through the transistor $Q_{13}$. Therefore, the node $N_1$ is not boosted and the transistor $Q_{12}$ is not turned on even when the clock signal $\phi_A$ is applied. Accordingly, the information "0" is not changed to "1" even when the clock signal $\phi_A$ is applied. The above-mentioned normal operation is well known.

Figure 2C:
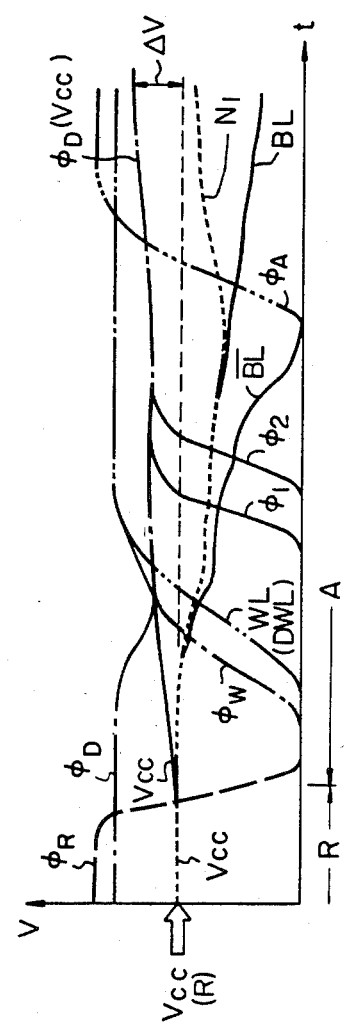
FIG. 2C is a waveform diagram for explaining an abnormal operation in a conventional RAM which does not include the voltage holding circuit.

Conventionally, the voltage holding circuit 7 is not provided in an RAM and the drains of the transistors $Q_{15}$ and $Q_{16}$ in the clock signal generating circuit 6 are connected to the power supply line $V_{CC}$. In the conventional RAM, a problem is caused when the power supply voltage $V_{CC}$ fluctuates. The function and advantages of providing the voltage holding circuit 6 will be easily understood by considering the problem in the conventional RAM with reference to FIG. 2C. When the RAM of FIG. 1 is not provided with the voltage holding circuit 7, as in a conventional RAM, and when the power supply voltage $V_{CC}$ is raised to $V_{CC}+\Delta V$ in the active interval A, the clock signal $\phi_W$ is also raised to $V_{CC}+\Delta V$ so that the potential of the clock signal $\phi_D$ is also raised to $V_{CC}+\Delta V$ in the active interval, as illustrated in FIG. 2C. This causes an expansion of the potential difference between the clock signal $\phi_D$ applied to the gate of the transistor $Q_{13}$ and the bit line BL connected to the source of the transistor $Q_{13}$, resulting in the potential difference becoming greater than the threshold voltage of the transistor $Q_{13}$ to turn it on. For example, when the potential of the clock signal $\phi_D$ is 6 V, which is higher than the power supply voltage of 5 V, when the potential of the bit line BL is 4 V, and, further, when the threshold voltage of the transistor $Q_{13}$ is 1.7 V, then the transistor $Q_{13}$ is in a conductive state. In this case, even when the clock signal $\phi_A$, having a sufficiently high potential higher than the H level, is applied to the MIS capacitor $Q_{14}$, charges at the node $N_1$ leak through the conductive-state transistor $Q_{13}$ to the bit line BL, so that the potential at the node $N_1$ is not sufficiently boosted to completely turn on the transistor $Q_{12}$. Therefore, the bit line BL is not supplied with sufficient charge to be raised to the H level. As a result, the charges in the MIS capacitor $Q_8$ are insufficient to store the information "1", and the potential of the bit line BL cannot be charged up to the H level, as illustrated in FIG. 2C. With insufficient charges in the MIS capacitor $Q_8$, the sense amplifier 1 takes a long time, in the next active interval, to detect the potential difference between the bit lines BL and $\overline{BL}$, or, in the worst case, the sense amplifier 1 detects an error data of "0" in the next active interval.

By providing the voltage holding circuit 7 according to the present invention, such an error operation or disadvantage can be eliminated. The voltage holding circuit 7 comprises a resistor R and an MIS capacitor Q connected in series between the power supply line $V_{CC}$ and ground and comprises an MIS transistor T connected in parallel with the resistor R. In the integrated circuit, the resistor R may preferably be a depletion-type MIS transistor having a gate and a source commonly connected to the power supply line $V_{CC}$. During each reset interval, the reset clock signal $\phi_R$ is applied to the gate of the MIS transistor T to turn it on so that the MIS capacitor Q is charged. The charging time constant of the MIS transistor T and the MIS capacitor Q is made to be sufficiently smaller than the reset interval, and, for example, is 50 nanoseconds. Therefore, during each reset interval, the potential at a constant power supply line $V_{CC}^*$, which is commonly connected to the source of the MIS transistor T and to the connecting point between the resistor R and the MIS capacitor Q, is equal to the power supply voltage $V_{CC}$. While, during each active interval, the reset clock signal $\phi_R$ is turned off. If the power supply voltage $V_{CC}$ fluctuates and is lowered during an active interval, charges in the MIS capacitor Q are discharged through the resistor R to the power supply line $V_{CC}$. And, if the power supply voltage $V_{CC}$ fluctuates and is higher during an active interval, charges on the power supply line $V_{CC}$ are passed through the resistor R into the MIS capacitor Q. The time constant of the resistor R and the MIS capacitor Q is made to be sufficiently larger than the active interval, and, for example, is several milliseconds. Therefore, even when the power supply line $V_{CC}$ fluctuates during an active interval, the potential at the constant power supply line $V_{CC}^*$ is approximately equal to the power supply voltage $V_{CC}$ during the reset interval just before the active interval.

The constant power supply line $V_{CC}^*$ is connected to the drains of the transistors $Q_{15}$ and $Q_{16}$ in the clock signal generating circuit 6. Therefore, during an active interval, even when the power supply voltage $V_{CC}$ fluctuates, the potential of the clock signal $\phi_D$ during the active interval is approximately equal to the power supply voltage $V_{CC}$ during the reset interval just before the active interval. As a result, during each active interval, the potential difference between the gate of the transistor $Q_{13}$, to which the clock signal $\phi_D$ is applied, and the source of the transistor $Q_{13}$, to which the bit line BL is connected, does not exceed the threshold voltage of the transistor $Q_{13}$ as long as the memory cell 2 stores the information "1". Consequently, by applying the clock signal $\phi_A$ to the MOS capacitor $Q_{14}$, the potential at the node $N_1$ is boosted to be sufficiently high so that the bit line BL is charged to the $V_{CC}$ level. Thus, the MIS capacitor $Q_8$ can be charged to restore the information "1".

Since the active interval of a dynamic RAM is approximately 100 nanoseconds, the time constant of the MIS capacitor Q and the resistor R may be on the order of microseconds or milliseconds for realizing a stable constant voltage power supply.

Figure 3:
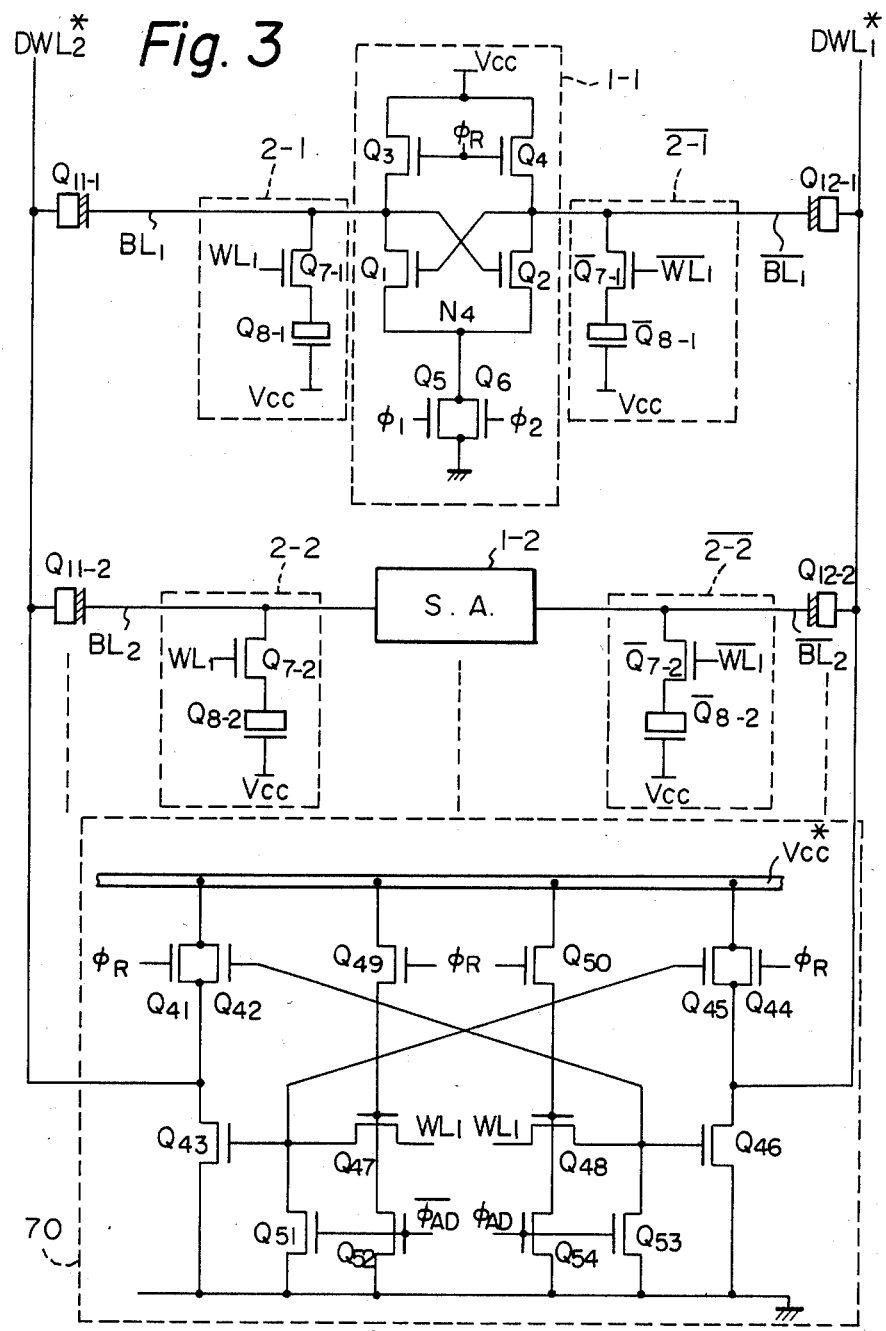
FIG. 3 is a circuit diagram illustrating a part of a dynamic random access memory (RAM) of a one-transistor one-capacitor type in which dummy word lines are clamped to predetermined values, according to a second embodiment of the present invention.

Another embodiment of the present invention is illustrated in FIG. 3 in which another type of one-transistor one-capacitor type dynamic RAM is illustrated. The main differences between the RAM of FIG. 1 and the RAM of FIG. 3 are that, in FIG. 3, in place of the dummy cell 3 in FIG. 1, each dummy cell is constructed by a single MIS capacitor $Q_{11-1}$, $Q_{11-2}$, $Q_{12-1}$, $Q_{12-2}$, etc., and that, instead of applying the constant voltage to the clock signal generating circuit 6 in FIG. 1, dummy word line $DWL_1^*$ or $DWL_2^*$ is clamped to a predetermined potential. The RAM 64 FIG. 3 comprises a plurality of sense amplifiers 1—1, 1—2, . . . ; a plurality of memory cells 2—1, 2—2, . . . connected to bit lines $BL_1$, $BL_2$, . . . respectively; a plurality of memory cells $\overline{2-1}$, $\overline{2-2}$, . . . connected to bit lines $\overline{BL_1}$, $\overline{BL_2}$, . . . , respectively; a plurality of dummy cells $Q_{11-1}$, $Q_{11-2}$, . . . connected to bit lines $BL_1$, $BL_2$, . . . , respectively; and a plurality of dummy cells $Q_{12-1}$, $Q_{12-2}$, . . . connected to the bit lines $\overline{BL_1}$, $\overline{BL_2}$, . . . , respectively. The bit lines $BL_1$, $BL_2$, . . . are respectively connected through the dummy cells $Q_{11-1}$, $Q_{11-2}$, . . . to a dummy word line $DWL_2^*$. Similarly, the bit lines $\overline{BL_1}$, $\overline{BL_2}$, . . . are connected to another dummy word line $DWL_1^*$.

Active pull-up circuits and clock signal generating circuits are, in practice, connected to bit lines. For the purpose of simplicity, however, the circuits are not shown in FIG. 3.

When a memory cell on the left-hand side of the sense amplifiers 1—1 or 1—2 is to be selected, the right-hand side dummy word line $DWL_1^*$ is the selected dummy word line and the potential of the selected dummy word line $DWL_1^*$ is turned to the L level. On the other hand, the potential of the nonselected dummy word line $DWL_2^*$ is clamped to the H level. The advantage of the nonselected word line not floating but being clamped to the H level is that the interference between bit lines through the dummy cells is suppressed.

A voltage holding circuit 70 operates to clamp the selected dummy word line to the L level and the nonselected dummy word line to the H level. The circuit 70 comprises transistors $Q_{41}$ through $Q_{54}$. The circuit configuration of the circuit 70 per se is well known. In the embodiment of FIG. 3, as a power supply line of the voltage holding circuit 70, the constant power supply line $V_{CC}^*$ of the voltage holding circuit 7 in FIG. 1 is employed.

Figure 4A:
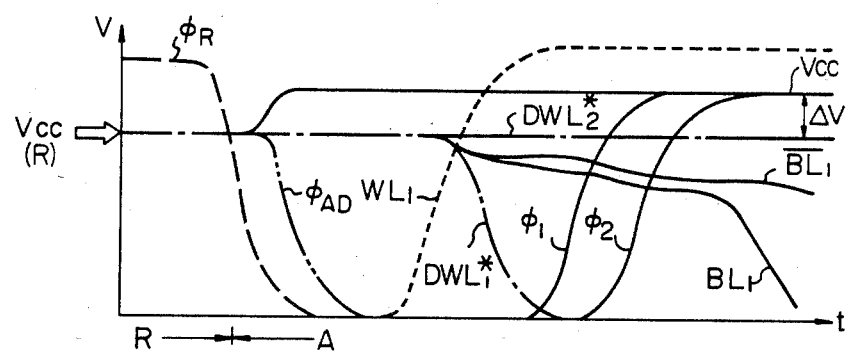
FIG. 4A is a waveform diagram for explaining the operation of the circuit of FIG. 3.

In operation, assume that the MIS capacitor $Q_{8-1}$ in the memory cell 2—1 is storing an information "0". In a reset interval R, the reset clock signal $\phi_R$ is applied to the gates of the transistors $Q_{41}$ and $Q_{44}$ so that both of the dummy word lines $DWL_1^*$ and $DWL_2^*$ are clamped to the H level as illustrated in FIG. 4A. After the reset clock signal $\phi_R$ falls to the L level, an active interval A starts. In the active interval A, an address clock signal $\phi_{AD}$ (not shown in FIG. 4A) for selecting the left-hand side memory cells is selected to be the H level, and an address clock signal $\overline{\phi_{AD}}$ for selecting the right-hand side memory cells is kept to the L level. Then, the word line $WL_1$ is raised to turn on the transistors $Q_{43}$ and $Q_{46}$. The H level of the address clock signal $\phi_{AD}$ is applied to the gate of the transistor $Q_{51}$ to turn it on so that the gates of the transistors $Q_{43}$ and $Q_{45}$ are the L level. On the other hand, the L level of the address clock signal $\overline{\phi_{AD}}$ is applied to the gate of the transistor $Q_{53}$ to keep it in an off state so that the gates of the transistors $Q_{46}$ and $Q_{42}$ are the H level. Thus, the potential of the selected dummy word line $DWL_1^*$ falls to the L level as illustrated in FIG. 4A, and the nonselected dummy word line $DWL_2^*$ is kept at the H level. Because the non-selected dummy word line $DWL_1^*$ is at the L level, charges on the nonselected bit line $\overline{BL_1}$ are discharged through the dummy cell $Q_{12-1}$ to the dummy word line $DWL_1^*$ so that the potential of the nonselected bit line $\overline{BL_1}$ falls to a reference level between the H and the L levels. On the other hand, since the MIS capacitor $Q_{8-1}$ stores no charge, charges on the selected bit line $BL_1$ are passed through the MIS transistor $Q_{7-1}$ into the MIS capacitor $Q_{8-1}$ so that the potential of the bit line $BL_1$ falls to a level lower than the potential of the nonselected bit line $\overline{BL_1}$. After this, when the clock signals $\phi_1$ and $\phi_2$ are applied to the gates of the transistors $Q_5$ and $Q_6$, the sense amplifier 1—1 is activated to detect and amplify the potential difference between the bit lines $BL_1$ and $\overline{BL}_1$. Thus, the information stored in the memory cell 1—1 can be read out.

Figure 4B:
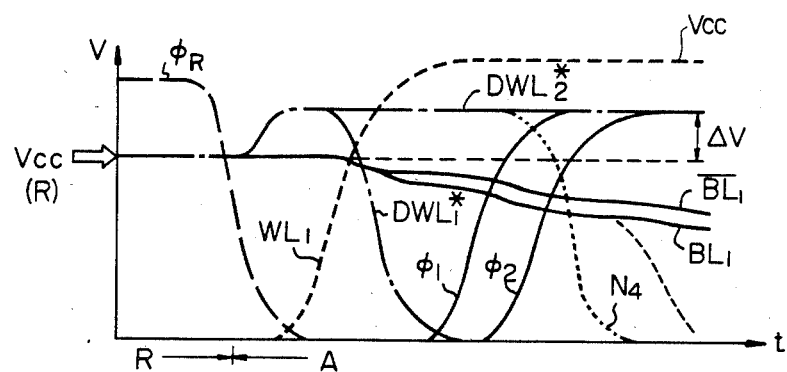
FIG. 4B is a waveform diagram for explaining the conventional operation when the dummy word lines in the circuit of FIG. 3 are not clamped.

Conventionally, in the voltage holding circuit 70, instead of the constant power supply line $V_{CC}^*$, the power supply line $V_{CC}$ is employed, so that the H level of the nonselected dummy word line fluctuates along with the fluctuation of the power supply voltage $V_{CC}$. This causes a problem, as described below, with reference to FIG. 4B. That is, when the power supply voltage $V_{CC}$ rises, in the active interval A, to $V_{CC}+\Delta V$, the nonselected dummy word line $DWL_2^*$, to which, instead of the constant voltage $V_{CC}^*$, the power supply voltage $V_{CC}$ is applied through the transistor $Q_{42}$, is also raised to $V_{CC}+\Delta V$, as illustrated in FIG. 4B. Therefore, charges on the nonselected dummy word line $DWL_2^*$ flow through the nonselected dummy cell $Q_{11-1}$ to the selected bit line $BL_1$. As a result, the potential of the bit line $BL_1$ is not sufficiently lowered for reading the information "0". That is, since the potential difference between the bit lines $BL_1$ and $\overline{BL}_1$ is too small, the sense amplifier 1—1 cannot detect the difference, or, in the worst case, the potential of the selected bit line $BL_1$ becomes higher than the potential of the nonselected bit line $\overline{BL}_1$ so that a reading error occurs.

In case the memory cell 2—1 is storing an information "1", the problem is also caused when the power supply voltage $V_{CC}$ is lowered during an active interval.

By providing the constant power supply line $V_{CC}^*$ as the power supply line of the voltage holding circuit 70, the above-mentioned problem can be overcome.

Figure 5:
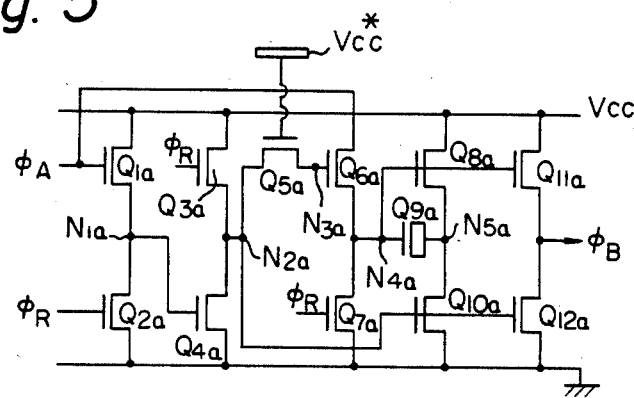
FIG. 5 is a circuit diagram of a dynamic clock signal generating circuit according to a third embodiment of the present invention.
Figure 6A:
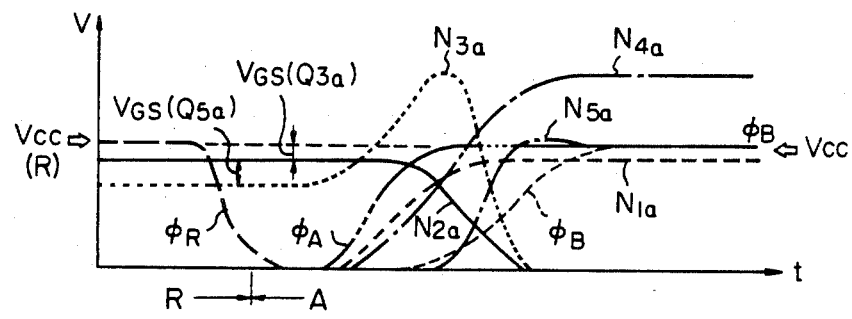
FIG. 6A is a waveform diagram for explaining the operation of the circuit of FIG. 5.

A third embodiment of the present invention will be described with reference to FIG. 5 and FIGS. 6A and 6B. FIG. 5 is an example of a clock signal generating circuit being operated alternately a reset state or in an active state. This circuit is a bootstrap circuit and operates to amplify an input signal $\phi_A$ and shape the waveform of the amplified signal to provide an output signal $\phi_B$. The circuit comprises transistors $Q_{1a}$ through $Q_{12a}$. Referring to FIG. 5 and FIG. 6A, normal operation will first be explained. In a reset interval, a reset clock signal is at the H level so that the transistors $Q_{2a}$ and $Q_{7a}$ are conductive and therefore the nodes $N_{1a}$ and $N_{4a}$ are at the L level. Because the node $N_{1a}$ is at the L level, the transistor $Q_{4a}$ is off. And, because the node $N_{4a}$ is at the L level, the transistors $Q_{8a}$ and $Q_{11a}$ are off. The reset clock signal $\phi_R$ is also applied to the gate of the transistor $Q_{3a}$ to turn it on so that the node $N_{2a}$ is at the H level slightly lower than the power supply voltage $V_{CC}$ (when $V_{CC}$ is 5 V, the H level of the node $N_{2a}$ is about 4.2 V). The node $N_{2a}$ is connected to the gates of the transistors $Q_{10a}$ and $Q_{12a}$ so that these transistors $Q_{10a}$ and $Q_{12a}$ are in the on state. Therefore, the output signal $\phi_B$ is at the L level. In the reset interval R, because the charges on the node $N_{2a}$ flow through the transistor $Q_{5a}$ to the node $N_{3a}$, the potential at the node $N_{3a}$ is at an H level but lower than the potential at the node $N_{2a}$ (when $V_{CC}$ is 5 V, the potential at the node $N_{3a}$ is about 3.6 V).

After the reset clock signal $\phi_R$ falls to the L level, an active interval A starts. When the input signal $\phi_A$ rises to the H level in the active interval A, the potential at the node $N_{3a}$ is boosted to a level higher than $V_{CC}$ due to the capacitance between the drain and the gate of the transistor $Q_{6a}$, so that the transistor $Q_{6a}$ turns on. Therefore, the potential at the node $N_{4a}$ is boosted to the H level. Then, in response to the rising of the input signal $\phi_A$, the potential at the node $N_{2a}$ falls to the L level so that the transistor $Q_{10a}$ is turned off, and the potential at the node $N_{5a}$ is boosted. Then, by a positive feedback through the transistors $Q_{8a}$ and $Q_{9a}$, the transistor $Q_{9a}$ being an MOS capacitor, the potential at the node $N_{4a}$ is further boosted so that the transistor $Q_{11a}$ is turned on. Thus, in normal operation, in response to the input signal $\phi_A$, the output signal $\phi_B$ obtains the H level.

It should be noted that, in the embodiment of FIG. 5, because the gate of the transistor $Q_{5a}$ is connected to the constant power supply line $V_{CC}^*$, which is the same as that in FIG. 1, no error operation occurs due to the fluctuations of the power supply voltage $V_{CC}$.

Figure 6B:
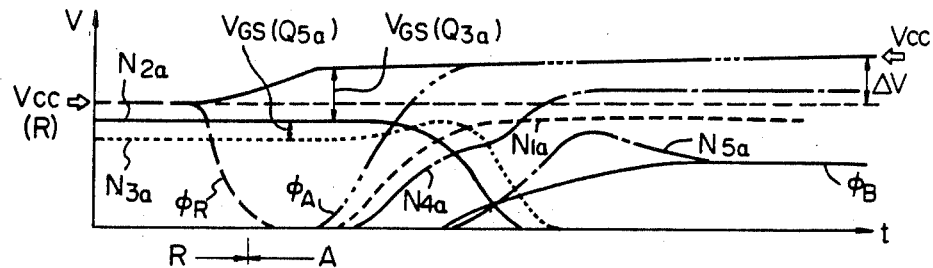
FIG. 6B is a waveform diagram for explaining a conventional operation when the circuit of FIG. 5 does not include the voltage holding circuit.

If the gate of the transistor $Q_{5a}$ is connected to the power supply line as in the conventional circuit, the following error operation is caused and will be apparent with reference to FIG. 6B. Assume that the power supply voltage $V_{CC}$ rises to $V_{CC}+\Delta V$ during an active interval. Then, the potential difference between the gate and the node $N_{2a}$ increases to a value greater than the threshold voltage of the transistor $Q_{5a}$. Therefore, at the time when the input signal $\phi_A$ is applied, the transistor $Q_{5a}$ has already been turned on so that the charges on the node $N_{3a}$ leak through the transistor $Q_{5a}$ to the node $N_{2a}$, resulting in the node $N_{3a}$ not being boosted enough. As a result, the transistor $Q_{6a}$ is not completely turned on. Accordingly, the potential at the node $N_{4a}$ is not increased as the power supply voltage $V_{CC}+\Delta V$ increases. Consequently, the transistor $Q_{11a}$ is not completely turned on, and, therefore, the output signal $\phi_B$ cannot be increased to the H level.

In the embodiment of FIG. 5, in order to prevent the above-mentioned error operation, the gate of the transistor $Q_{5a}$ is connected to the constant power supply line $V_{CC}^*$. By applying the constant voltage $V_{CC}^*$ to the gate of the transistor $Q_{5a}$, the potential difference between the gate of the transistor $Q_{5a}$ and the node $N_{2a}$ does not exceed the threshold voltage before the input signal $\phi_A$ is applied, and, therefore, the nodes $N_{3a}$ and $N_{4a}$ are sufficiently boosted, so that the output signal $\phi_B$ is reliably increased to the H level.

In the foregoing embodiments, although the constant power supply line $V_{CC}^*$ is connected to a specific point in each circuit, the constant power supply line $V_{CC}^*$ may be connected to any desired point sensitive to the fluctuation of the power supply voltage in any dynamic MIS transistor circuit. The voltage holding circuit 7 shown in FIG. 1 may be connected not only to the aforementioned one-transistor one-capacitor dynamic RAM's or dynamic clock signal generating circuit, but also to any dynamic MIS transistor circuit. Further, the voltage holding circuit is not restricted to the type illustrated but may be any type as long as it can be integrated.

From the foregoing description, it will be apparent that, according to the present invention, since a voltage holding circuit is integrated in a dynamic MIS transistor circuit, and since the voltage holding circuit has a capacitor with a large capacitance, the capacitor charges during the reset interval and the charged voltage is used as a power supply voltage during the active interval. Error operation in a dynamic MIS transistor circuit, due to fluctuation of the power supply voltage, is prevented.

We claim:

1. An MIS transistor circuit operated alternately in a reset state or in an active state and operatively connected to receive input signals, comprising:

at least one operating node;

at least one input terminal, operatively connected to receive the input signals and operatively connected to said at least one operating node and the MIS transistor circuit, said at least one operating node being charged or discharged during the reset state, and the MIS transistor circuit being operated in response to the input signals applied to said at least one input terminal during the active state;

a voltage holding circuit, operatively connected to said at least one operating node, for holding a power supply voltage applied during the reset state to a clamped voltage, said clamped voltage and for applying during the active state as an actual power supply voltage to predetermined nodes of said at least one operating node of the MIS transistor circuit.

2. An MIS transistor circuit as set forth in claim 1, wherein the MIS transistor circuit is an MIS dynamic memory comprising:

bit lines operatively connected to said voltage holding circuit;

word lines intersecting said bit lines;

dynamic-type memory cells operatively connected at said intersections of said bit lines and said word lines;

active pull-up circuits, operatively connected to said bit lines, for selectively pulling up the voltages of said bit lines during the active state; and clock signal generating circuits, operatively connected to said active pull-up circuits and said voltage holding circuit, each clock signal generating circuit having a power supply line for selectively driving said active pull-up circuits during the active state, the clamped voltage from said voltage holding circuit being applied to the power supply line of each of said clock signal generating circuits.

3. An MIS transistor circuit as set forth in claim 1, wherein the MIS transistor circuit is an MIS dynamic memory comprising:

bit lines operatively connected to said voltage holding circuit;

word lines intersecting said bit lines;

dynamic-type memory cells operatively connected at said intersections of said bit lines and said word lines;

dummy cells, operatively connected to said dynamic-type memory cells, for storing reference information;

dummy word lines, operatively connected to said bit lines, respectively; and a dummy word line clamping circuit, operatively connected to said dummy word lines, for clamping the potentials of said dummy word lines to predetermined levels.

4. An MIS transistor circuit as set forth in claim 1, wherein the MIS transistor circuit is a clock signal generating circuit, comprising:

a bootstrap circuit, operatively connected to said voltage holding circuit and having a plurality of inverters and a node, for amplifying and waveform shaping the input signals; and a transfer transistor, having a gate operatively connected to receive the clamped voltage and having a source and drain operatively connected between two of said plurality of inverters of said bootstrap circuit, for charging the node in the bootstrap circuit during the reset state.

5. An MIS transistor circuit as set forth in claim 1, 2, 3, or 4, wherein said voltage holding circuit comprises:

an MIS transistor having a gate operatively connected to receive a reset signal during the reset state;

a capacitor operatively connected in series with said MIS transistor; and a resistor operatively connected in parallel with said MIS transistor and in series with said capacitor, said MIS transistor and capacitor comprising a first time constant circuit having a first time constant shorter than a reset interval during the reset state, and said resistor and capacitor comprising a second time constant circuit having a second time constant longer than an active interval during the active state.

6. A MIS transistor circuit as set forth in claim 5, wherein said capacitor is an MIS capacitor.

7. A circuit comprising:

an MIS transistor circuit operated alternately in set and reset states and operatively connected to receive input signals, including at least one operating node and at least one input terminal operatively connected to receive the input signals, said at least one operating node being charged or discharged during the reset state and said MIS transistor circuit being operated in response to the input signals applied to said at least one input terminal during the active state; and a voltage holding circuit, operatively connected to said at least one operating node, for holding a power supply voltage, applied during the reset state, to a clamped voltage, and for applying said clamped voltage as an actual power supply voltage to predetermined nodes of said at least one operating node during the active state.

8. A circuit as set forth in claim 7, wherein said MIS transistor circuit is a MIS dynamic memory circuit for storing a reference data, comprising:

bit lines each having a potential;

word lines intersecting said bit lines;

memory cells located at said intersections of said word lines and bit lines;

dummy word lines operatively connected to said bit lines;

dummy cells, respectively, operatively connected to said bit lines, for storing the reference data;

dummy word line clamping circuits, operatively connected to said dummy word lines, for clamping said dummy word lines to a predetermined voltage level;

sense amplifiers, operatively connected to said bit lines, for detecting the potential difference between two of said bit lines;

active pull-up circuits, respectively, operatively connected to said bit lines, for expanding the potential difference between two of said bit lines;

a clock signal generating circuit, operatively connected to said active pull-up circuits, for generating a clock signal and driving said active pull-up circuits and wherein said voltage holding circuit is operatively connected to said clock signal generating circuit.

9. A circuit as set forth in claim 8, operatively connected to receive a reset clock signal, wherein said voltage holding circuit comprises:

a capacitor operatively connected to ground;

a resistor operatively connected in series with said capacitor and the voltage supply;

a transistor, operatively connected in parallel with said resistor, having a gate for receiving the reset clock signal and having a source; and a constant power supply line, operatively connected to said source of said transistor, between said resistor and capacitor and to said clock signal generating circuit, for supplying a constant voltage to said clock signal generating circuit.

10. A circuit as set forth in claim 8, wherein said dummy cells each comprise a single capacitor.

11. A circuit as set forth in claim 8, wherein said voltage holding circuit comprises:

a plurality of transistors for clamping said dummy word lines to the predetermined level; and a constant power supply line operatively connected to said plurality of transistors.

12. A circuit as set forth in claim 8, wherein said clock signal generating circuit is operatively connected to receive the input signals and comprises a bootstrap circuit, operatively connected to said voltage holding circuit and said active pull-up circuits, for amplifying and shaping the input signals and providing output signals to said active pull-up circuits.

13. An MIS transistor circuit operated alternately in a reset state and an active state, comprising:

a power supply line for supplying a power source voltage;

at least one operating node;

precharge means, connected between said power supply line and said at least one operating node, for precharging said at least one operating node during the reset state;

a circuit element connected to said at least one operating node; and a voltage holding circuit, operatively connected to said precharge means, comprising:

an output node connected to said precharge means;

a capacitor connected to said output node; and first switching means, connected between said power supply line and said output node, said first switching means being turned on and holding said power source voltage in said capacitor during the reset state and outputting said power source voltage to said output node, and said first switching means being turned off and supplying a constant voltage from said output node to said circuit element during the active state, said circuit element being responsive to the constant voltage at said output node during the active state.

14. An MIS transistor circuit according to claim 13, further comprising a second switching means operatively connected to said circuit element and turning on during the active state.

15. An MIS transistor circuit operated alternately in a reset state and an active state and operatively connected to receive an input signal, comprising:

a power supply line for supplying a power source voltage;

a bootstrap circuit being responsive to the input signal during the active state, comprising:

a first MIS transistor having a gate boosted in response to the input signal during the active state;

a second MIS transistor, operatively connected to said gate of said first MIS transistor, and having a gate; and precharge means, operatively connected to said second transistor, for supplying a precharge voltage from said power supply line to said gate of said first MIS transistor, through said second MIS transistor, during the reset state; and a voltage holding circuit operatively connected to said precharge means, comprising:

an output node operatively connected to said gate of said second MIS transistor;

a capacitor operatively connected to said output node; and switching means operatively connected between said power supply line and said output node, said switching means being turned on and holding said power source voltage in said capacitor during the reset state and outputting said power source voltage to said output node, and being turned off and supplying the power source voltage from said output node to said gate of said second MIS transistor during the active state.

* * * * *

UNITED STATES PATENT AND TRADEMARK OFFICE
CERTIFICATE OF CORRECTION

PATENT NO. : 4,578,781
DATED : MARCH 25, 1986
INVENTOR(S) : JUNJI OGAWA ET AL.

It is certified that error appears in the above-identified patent and that said Letters Patent is hereby corrected as shown below:

```
Col. 2, line 26,                           "during" should be
            --in--; and "in" should be --during--;
        line 39, "a" should be --.--.

Col. 4, line 59, after "Ω₁₆" insert --,--.

Col. 6, line 20, "an" should be --the--.

Col. 7, line 65, "64" should be --of--.

Col. 8, line 41, "∅" should be --∅--;
        line 47, "∅" should be --∅--.

*Col. 9, line 36, after "alternately" insert --in--.

*Col. 12, line 17, "A" should be --An--.
```

Signed and Sealed this

Fifteenth Day of July 1986

[SEAL]

Attest:

DONALD J. QUIGG

Attesting Officer

Commissioner of Patents and Trademarks